United States Patent
Konshak

(10) Patent No.: US 7,436,666 B1
(45) Date of Patent: Oct. 14, 2008

(54) THERMAL CACHING FOR LIQUID COOLED COMPUTER SYSTEMS

(75) Inventor: Michael V. Konshak, Louisville, CO (US)

(73) Assignee: Sun Microsystems, Inc., Santa Clara, CA (US)

( * ) Notice: Subject to any disclaimer, the term of this patent is extended or adjusted under 35 U.S.C. 154(b) by 268 days.

(21) Appl. No.: 11/463,243

(22) Filed: Aug. 8, 2006

(51) Int. Cl.
*H05K 7/20* (2006.01)
*G08B 17/00* (2006.01)

(52) U.S. Cl. .................. 361/699; 361/701; 165/80.4; 165/104.33; 340/584

(58) Field of Classification Search ............... None
See application file for complete search history.

(56) References Cited

U.S. PATENT DOCUMENTS

| | | | | |
|---|---|---|---|---|
| 4,729,424 A | * | 3/1988 | Mizuno et al. ............. | 165/261 |
| 5,115,225 A | * | 5/1992 | Dao et al. .................. | 340/584 |
| 6,182,742 B1 | * | 2/2001 | Takahashi et al. ......... | 165/104.33 |
| 7,086,247 B2 | * | 8/2006 | Campbell et al. .......... | 62/259.2 |
| 7,088,585 B2 | * | 8/2006 | Chu et al. .................. | 361/699 |
| 7,106,590 B2 | * | 9/2006 | Chu et al. .................. | 361/701 |
| 7,327,578 B2 | * | 2/2008 | Novotny .................... | 361/724 |
| 7,349,213 B2 | * | 3/2008 | Campbell et al. .......... | 361/699 |
| 2007/0297136 A1 | * | 12/2007 | Konshak .................... | 361/699 |

* cited by examiner

*Primary Examiner*—Boris L Chervinsky
(74) *Attorney, Agent, or Firm*—Michael C. Martensen; Kent A. Lembke; Marsh Fischmann & Breyfogle LLP

(57) ABSTRACT

The failure of a data center liquid cooling system can result in a rapid temperature rise in electronic components that may either damage a component, result in the loss of data housed within the component, or both. A supplemental liquid cooling system is placed within each rack serviced by a data center cooling system to mitigate such a failure. Coolant flow is monitored to determine whether the data center liquid cooling system has, for a particular rack, failed. Upon determination of failure, the supplemental liquid cooling system is initiated to reduce the thermal rise of the electronic components within the rack allowing them to conduct an organized and complete shutdown.

20 Claims, 3 Drawing Sheets

THERMAL CACHING FOR LIQUID COOLED COMPUTER SYSTEMS

BACKGROUND OF THE INVENTION

1. Field of the Invention

This invention relates generally to electronic assemblies, and, more particularly, to thermal management of electronic assemblies using liquid cooling systems.

2. Relevant Background

Electronic devices generate heat during operation. Thermal management refers to the ability to keep temperature-sensitive elements in an electronic device within a prescribed operating temperature. As one might expect, thermal management has evolved to address the increased heat generation created within electronic devices as a result of increased processing speed/power of the electronic devices.

Historically, electronic devices were cooled by a natural radiation thermal management technique. The cases or packaging of these prior art electronic devices were designed with openings (e.g., slots) strategically located to allow warm air to escape and cooler air to be drawn in. As heat generation increased, fans were added to increase the volume of cooling air circulating around the heat generating electronics.

As the processing speeds and performance of computer systems climbs so too does heat production. The advent of high performance processors and electronic devices now require more innovative thermal management. Each of these increases in processing speed and power generally carries a cost of increased heat generation such that natural radiation is no longer sufficient to provide proper thermal management.

Several methods have been employed for cooling high performance electronic devices. One common method of cooling these types of devices is by attaching heat sinks. The heat sinks are typically used in combination with a fan that forces air to pass by the heat sinks and/or devices.

There are several problems with cooling systems that utilize some form of a heat sink and fan combination. One problem is that the fan must typically be located close to the fins of the heat sink to generate fully developed air flow. When a large fan is used in conjunction with a heat sink to cool an electronic component, a large percentage of the air moved by the system fan does not go through the heat sink. As a result, even large fans are not an efficient thermal solution for cooling some electronic devices.

Some high performance cooling systems utilize multiple fans to maintain proper operating temperatures. However, the additional fans in multiple fan cooling systems adds unwanted expense to manufacturing such electronic devices. In addition, the additional fans are noisy, bulky and utilize an inordinate amount of space within the environment where the electronic device is located. A more significant limitation of this type of cooling is that air cooling relies on the ability to maintain a cool operating environment. As the heat being produced from each component rises and the density of the components increase, the amount of heat dissipated into the surrounding environment by the traditional air cooled means may exceed the capability of the environmental control system. Put simply, it becomes economically infeasible to keep a room at a consistent temperature that will facilitate air cooling.

An alternative but more costly system to manage the thermal energy output of high-powered processors is a single-phase, single loop pumped data center liquid cooling system. This type of system uses a heat exchanger that is thermally connected to each electronic device. The heat exchanger draws thermal energy from the device and heats up a liquid coolant that is passed through the heat exchanger. A pump transfers the liquid coolant through a second heat exchanger that draws the thermal energy from the liquid coolant. The liquid coolant leaves the second heat exchanger at a low enough temperature to cool the processor once the coolant cycles back to the first heat exchanger.

Another solution to the thermal management problem is an internal liquid cooling system. In such a system the electronic components are placed on a cold plate through which a working fluid, such as a refrigerant or other coolant, is passed. Heat is rejected from the electronic components into the working fluid passing through the cold plate. Typically, the emerging working fluid is then run through an air-cooled heat exchanger where the heat is rejected from the working fluid to an air-stream that takes the heat away from the system. While such systems may work well for their intended purpose, it normally results in a raising of the ambient temperature of the environment in which the electronic devices are housed. As the size of processors continues to decrease and the thermal production capacity continues to increase, even this form of thermal management becomes untenable. While heat is removed effectively from the individual components, it is not adequately disposed of from the surrounding environment resulting in a raised ambient temperature and as the ambient temperature rises and the temperature gradient between the heat exchanger diminishes, thus the effectiveness of the cooling system is reduced.

The liquid cooling systems previously described suffer from several drawbacks. One drawback is that the systems are inefficient. Another drawback is that the systems require the use of at least one pump. These pumps require maintenance and commonly break down or leak onto one or more of the electrical components. Replacement, addition, or modification to the heat exchangers requires the integrity of the cooling loop to be compromised. Often the risk of rendering an entire system inoperative due to maintenance on a single cooling component is formidable.

Should the coolant flow be disrupted by a data center coolant system failure, critical components relying on the coolant such as a central processing unit or memory module can overheat within seconds if power is not immediately removed from the affected device. The timely detection of a coolant system failure, given the fluid dynamic constraints of the system, so as to allow the components to complete an organized and routine shutdown, is often not possible. The result is permanent damage of components and/or the permanent loss of data. While duplicate or redundant cooling systems could be implemented, the cost to do so makes such a system unattractive.

What is needed is an economical supplemental liquid cooling system, and its associated methods, for utilization in the event of a primary cooling system failure that provides enough cooling capability to the electronic components to allow these components to complete an organized shutdown prior to overheating. Specifically systems and methods are needed to reduce the temperature rise of critical components in the event of a data center coolant system failure before the components are damaged or the data contained within them is lost. These and other problems are addressed by the present invention as is illustrated by example in the description that follows.

SUMMARY OF THE INVENTION

Briefly stated, the present invention involves supplementing the liquid cooling path within a given rack of electronic components in order to reduce the temperature rise of critical components before damage or data loss can occur in the event of a primary cooling system failure. Liquid cooled racks generally have piping and heat exchangers that contain a certain volume of liquid or vapor that is being constantly replaced by a data center pump system. Upon a data center power or pump failure, the flow stops or is diminished. The coolant, however, is still present within the rack components. Upon detection of a lack of flow, an unexpected rise in the coolant temperature, or a significant reduction in flow pressure, and before any liquid can be drained away from the racks, an electrically or hydraulically operated valve bypasses the supply and return of the data center cooling path, creating an independent closed loop supplemental cooling system within the rack itself.

The volume of the liquid contained therein would, in one embodiment, be increased, as compared to normal system by the use of an in-line reservoir. A standby pump, much smaller than what would be required by the data center system itself, would circulate the fluids within the rack to continue the removal of heat away from critical components like the microprocessor or memory modules. The supplemental cooling loop retards the temperature rise sufficiently to allow the system to perform data housekeeping and to initiate an organized shutdown procedure. Accordingly, components are not damaged and data is not lost. The heat within the coolant of the supplemental cooling loop would be disbursed through the piping and an optional heat exchanger, which now becomes a radiator, into the rack structure itself through conduction, radiation and/or convection. In other embodiments, supplemental fans or blowers could be used to assist in removing heat out of the radiator or rack structure.

The features and advantages described in this disclosure and in the following detailed description are not all-inclusive, and particularly, many additional features and advantages will be apparent to one of ordinary skill in the relevant art in view of the drawings, specification, and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

BRIEF DESCRIPTION OF THE DRAWINGS

The aforementioned and other features and objects of the present invention and the manner of attaining them will become more apparent and the invention itself will be best understood by reference to the following description of a preferred embodiment taken in conjunction with the accompanying drawings, wherein.

The Figures depict embodiments of the present invention for purposes of illustration only. One skilled in the art will readily recognize from the following discussion that alternative embodiments of the structures and methods illustrated herein may be employed without departing from the principles of the invention described herein

DETAILED DESCRIPTION OF THE PREFERRED EMBODIMENTS

Exemplary embodiments of systems and methods for thermal caching in a liquid cooled computer system are hereafter presented. A supplemental or secondary liquid cooling loop is placed within a rack housing a plurality of electronic components to mitigate thermal rise in the event of failure of the primary or data center cooling loop. Data center cooling systems provide liquid coolant to a number of racks in a data center. Each rack typically houses a plurality of electronic components that are each in thermal contact with the coolant for the purpose of transferring heat away from the component to the coolant whereby the heat is thereafter transported outside of the data center.

Figure 1:
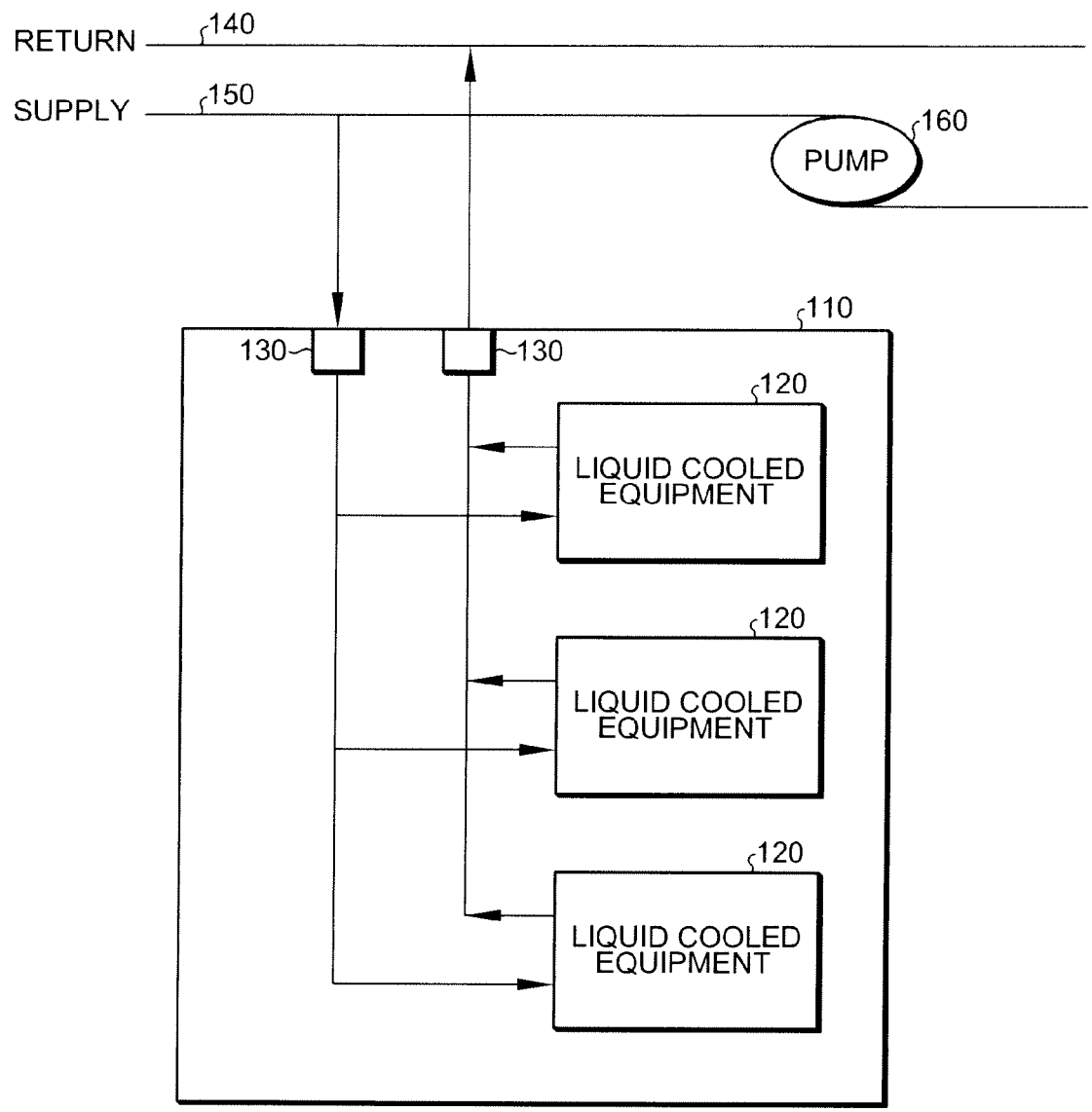
FIG. 1 shows a high level block diagram of a data center liquid cooling system for electronic components housed in a rack, as is known in the prior art.

As previously discussed, electronic components generate a great deal of heat yet they are very sensitive to temperature variations. Even a temporary failure of a data center's cooling system could severely damage a component and/or result in the loss of data. Data center cooling systems provide a continuous supply of cool coolant to the racks housing the electronic component, thermally interact with the electronic components in some manner, and convey heat away from the components and the rack to a heat exchanger located outside the data center. One depiction of a data center liquid cooling system, as is known in the prior art, is shown in FIG. 1. One or more racks 110 are coupled to data center coolant supply 150 and return lines by some type of quick disconnect fitting 130. Within the rack are a plurality of liquid cooled components or equipment 120 that are in thermal contact with the coolant.

The cool coolant enters the rack under pressure from a data center pump 160 that acts to circulate and distribute the coolant among the plurality of racks and components in the data center. The coolant is then channeled to each component 120 wherein some form or heat exchanger exists to transfer heat generated by the electronic component 120 to the coolant. The flow of coolant is continuous. Even if a rack 110 is disconnected from the data center cooling system, the coolant continues to flow to other racks possessing operable components.

A failure of the data center cooling system not only endangers the electronic components but the data housed within the components as well. Failure of the data center cooling system can take many forms. A failure of one or all of the pumps associated with the data center cooling system can result in a stagnation of the coolant or a reduced volumetric flow of the coolant through the racks. The coolant itself remains capable of accepting heat from the components but a lack of flow within the cooling system makes it ineffective at transporting the heat away from the component. A failure of the cooling system may also be recognized by a drop in pressure of the supply line or a unexpected rise in temperature of the coolant itself. When pressure is used to determine failure of the cooling system, a measure of both the static and dynamic pressure is conducted. The resulting total pressure provides immediate feedback that the primary pump may be nonfunctional and/or the fluid flow has decreased.

Figure 2:
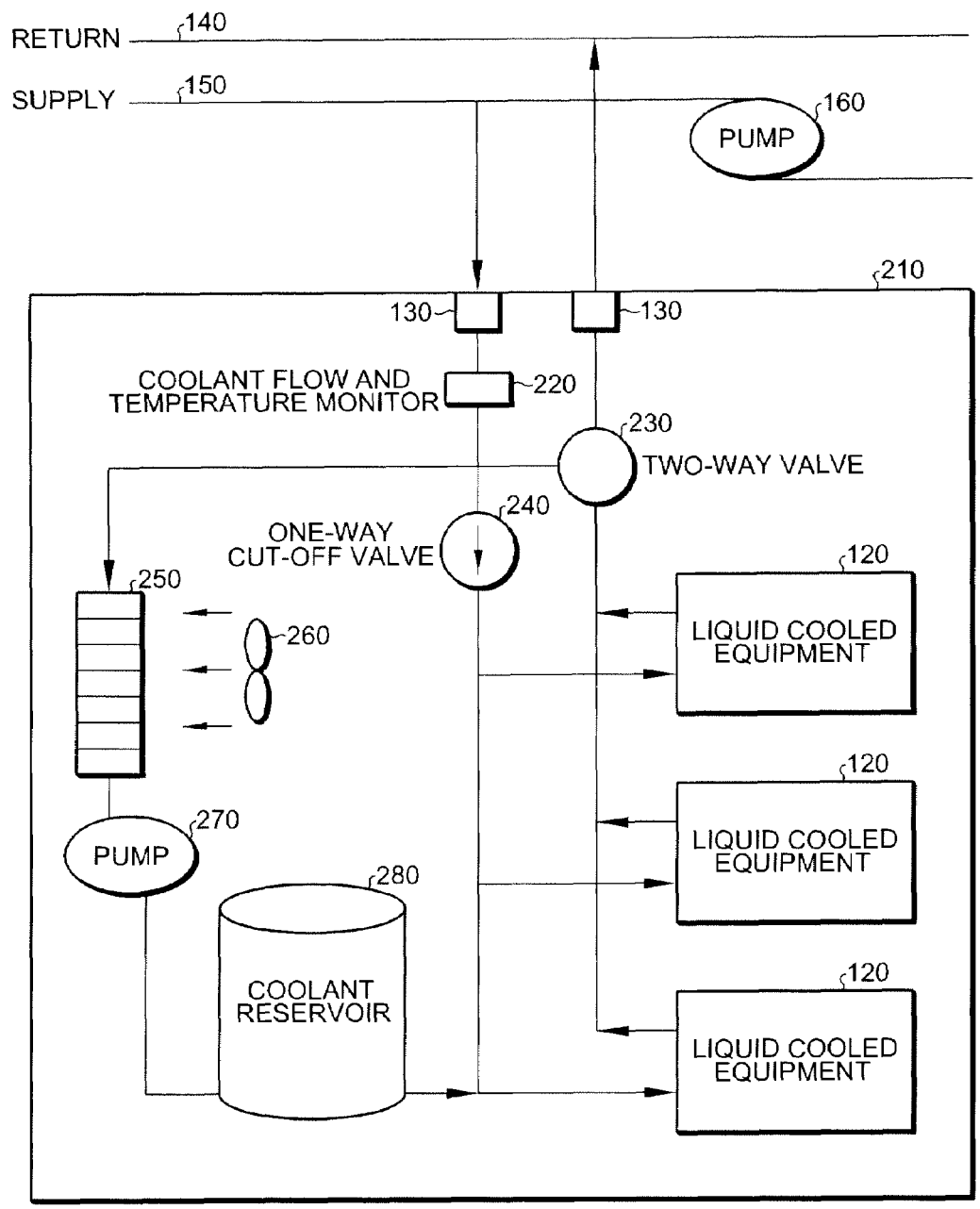
FIG. 2 shows a high level block diagram of one embodiment of the present invention for thermal caching a liquid cooled computer system.

One embodiment of a system for mitigating a failure of a data center's liquid cooling system is shown in FIG. 2. Shown is a high level block diagram of one embodiment of a system for thermal caching in a liquid cooled computer system. Under normal circumstances, coolant is delivered to a rack 210 housing a plurality of liquid cooled components 120 by a data center liquid cooling system supply 150 and return 140 lines. The supply 150 and return 140 lines are coupled to the rack 210 by quick disconnect fitting 130 and the coolant is pumped through the conduits by one or more data center pumps 160.

Within the rack 210 a secondary cooling loop is established that is in fluid communication with the data center cooling loop. Upon entering the rack 210 the data center supply line 150 enters a monitoring device 220. In one embodiment of the present invention the device 150 monitors fluid flow, pressure, and/or temperature. Other characteristics of the fluid that can also be used to identify a failure of the data center cooling system as imposed on the supply line 150. Thereafter, and before allowing the coolant to access any of the electronic components 120 housed within the rack 210, a one way valve 240 is placed on the supply lid entering the rock. The valve 240 allows fluid to pass from the data center cooling supply line 150 into the rack but prevents flow from regressing toward the supply line 150 should the flow stop and/or an adverse pressure gradient is experienced.

Similarly, a two way valve 230 is placed on the coolant return line that returns heated coolant from the electronic components 120 to the data center coolant return line 140. The two way valve 230 is in communication with the monitoring device 220 and capable of receiving a signal that indicates a failure in the primary or data center liquid cooling system. Upon receiving such a signal from the monitoring device 220, the two way valve 230 closes either electrically or hydraulically and diverts the return coolant from the electronic devices 120 to the supplemental or secondary liquid cooling loop. The supplemental liquid cooling loop, which is housed entirely within the rack 210, thereafter operates independent of the data center liquid cooling system.

As shown in FIG. 2, the supplemental liquid cooling loop comprises, in this embodiment of the present invention, a heat exchanger 250 with an air circulation fan 260, a pump 270, and a coolant reservoir 280. As is the two way valve 230, the pump 270 associated with the supplemental liquid cooling loop is in communication with the monitoring device 220. Upon an indication of failure of the data center liquid cooling loop, the monitoring device 220 directs the pump 270 associated with the supplemental liquid cooling loop to begin operating. The flow and increased pressure gradient in the supplemental liquid cooling loop forces coolant from the coolant reservoir 280 to the liquid cooled electronic components 120. As the pressure from the pump 270 associated with the supplemental liquid cooling loop is greater than the pressure in the data center liquid cooling loop, the one way valve 240 prevents any loss of coolant to the data center.

While the coolant of the supplemental liquid cooling system conveys heat away from the electronic components 120, it does not, in this embodiment of the present invention, possess the capability to maintain the operating temperatures of the electronic components 120 indefinitely. Thus, eventually the temperature of the coolant in the supplemental liquid cooling loop will be unable to convey heat away from the electronic components 120. As the supplemental liquid cooling loop simply mitigates or reduces the thermal rise of the electronic components 120 due to a failure of the data center liquid cooling loop, the monitoring device 220, in yet another embodiment of the present invention, signals to the electronic components housed within the rack 210 to begin an organized and complete shutdown. In doing so the supplemental liquid cooling loop prevents the electronic components from being damaged or any data being lost due to a loss of cooling from the data center cooling loop.

In another embodiment of the present invention, the reservoir is replaced by additional piping that can both facilitate the additional volume of coolant as well as the act as radiator for the heat. Accordingly the supplemental liquid cooling loop may have additional blowers or fans to facilitate the transfer of heat away from the electronic components and into the surrounding environment.

Figure 3:
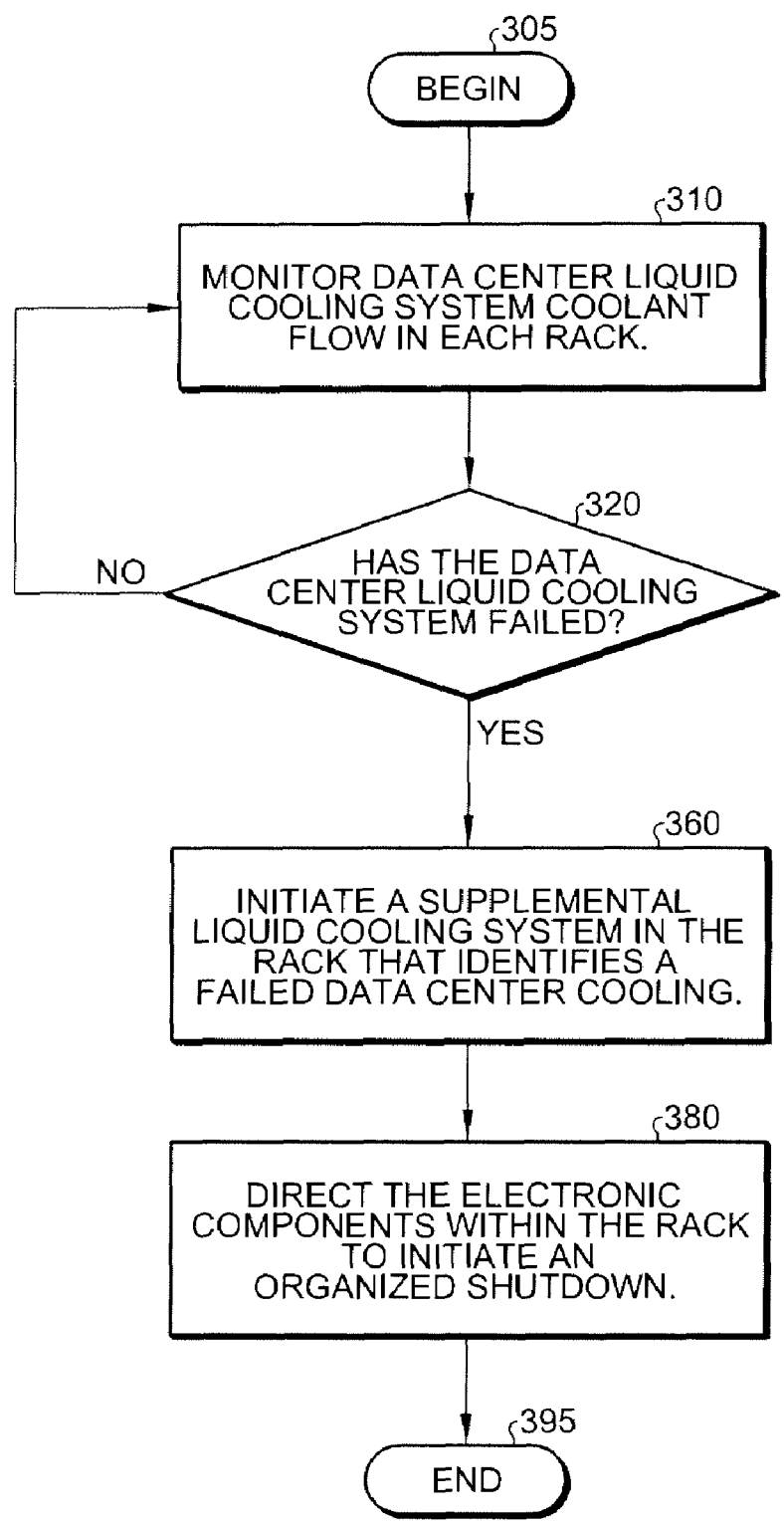
FIG. 3 is a flow diagram for one method embodiment for thermal caching a liquid cooled computer system, according to the present invention.

FIG. 3 is a flowchart illustrating a method of implementing an exemplary process for thermal caching a liquid cooled computer system. In the following description, it will be understood that each block of the flowchart illustrations, and combinations of blocks in the flowchart illustrations, can be implemented by computer program instructions. These computer program instructions may be loaded onto a computer or other programmable apparatus to produce a machine, such that the instructions which execute on the computer or other programmable apparatus create means for implementing the functions specified in the flowchart block or blocks. These computer program instructions may also be stored in a computer-readable memory that can direct a computer or other programmable apparatus to function in a particular manner, such that the instructions stored in the computer-readable memory produce an article of manufacture including instruction means which implement the function specified in the flowchart block or blocks. The computer program instructions may also be loaded onto a computer or other programmable apparatus to cause a series of operational steps to be performed in the computer or on other programmable apparatus to produce a computer implemented process such that the instructions which execute on the computer or other programmable apparatus provide steps for implementing the functions specified in the flowchart block or blocks.

As shown in FIG. 3, each rack monitors 310 the coolant flow arriving from the data center cooling loop used to cool the electronic components within the rack. The monitoring device examines the coolant's temperature, pressure and volume of flow. A unexpected decrease in the flow or pressure and/or an increase in the temperature of the coolant by a predetermined level provides evidence that the primary, data center liquid cooling system has failed for that particular rack. The method examines these criteria to establish whether 320 the data center liquid cooling system failure has occurred.

When the response to the query is no, the monitoring device continues to monitor the coolant flow as long as the components in the rack are in need of cooling. When the answer to the query is yes, the monitoring device initiates 360 a supplemental liquid cooling loop housed within the rack and isolates the supplemental liquid cooling loop from the data center liquid cooling loop. Simultaneously, the monitoring device directs the electronic components within the rack to save all volatile data to non-volatile media and begin an organized and complete shutdown of the components. While the supplemental liquid cooling loop will mitigate the loss of the primary liquid cooling loop and reduce the thermal rise, the components nonetheless must be shut down prior to the capacity of the supplemental liquid cooling loop being exceeded.

It will be appreciated by one of ordinary skill in the art that the blocks of the flowchart illustrations support combinations of means for performing the specified functions and combinations of steps for performing the specified functions. It will also be understood that each block of the flowchart illustrations, and combinations of blocks in the flowchart illustrations, can be implemented by special purpose hardware-based computer systems which perform the specified functions or steps, or combinations of special purpose hardware and computer instructions.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

While there have been described above the principles of the present invention in conjunction with thermal caching of liquid cooled computer system, it is to be clearly understood that the foregoing description is made only by way of example and not as a limitation to the scope of the invention. Particularly, it is recognized that the teachings of the foregoing disclosure will suggest other modifications to those persons skilled in the relevant art. Such modifications may involve other features which are already known per se and which may be used instead of or in addition to features already described herein. Although claims have been formulated in this application to particular combinations of features, it should be understood that the scope of the disclosure herein also includes any novel feature or any novel combination of features disclosed either explicitly or implicitly or any generalization or modification thereof which would be apparent to persons skilled in the relevant art, whether or not such relates to the same invention as presently claimed in any claim and whether or not it mitigates any or all of the same technical problems as confronted by the present invention. The Applicant hereby reserve the right to formulate new claims to such features and/or combinations of such features during the prosecution of the present application or of any further application derived therefrom.

I claim:

1. A system for supplementing liquid cooling of a plurality of electronic components in a data center, comprising:
    a primary liquid cooling loop in thermal contact with the plurality of electronic components;
    a supplemental liquid cooling loop in thermal contact with the plurality of electronic components wherein, responsive to failure of the primary liquid cooling loop's ability to maintain the plurality of electronic components in a thermally operable condition, the supplemental liquid cooling loop reduces thermal rise of the plurality of electronic components.

2. The system of claim 1, wherein, responsive to failure of the primary liquid cooling loop's ability to maintain the plurality of electronic components in a thermally operable condition, the supplemental liquid cooling loop enables the plurality of electronic components to complete an organized shutdown prior to the plurality of electronic components being damaged from thermal rise.

3. The system of claim 1, wherein, responsive to failure of the primary liquid cooling loop's ability to maintain the plurality of electronic components in a thermally operable condition, the supplemental liquid cooling loop enables the plurality of electronic components to save data prior to any data loss due to thermal rise.

4. The system of claim 1, wherein the supplemental liquid cooling loop includes an air-cooled heat exchanger.

5. The system of claim 1, wherein the supplemental liquid cooling loop, once initiated, operates independent of the primary liquid cooling loop.

6. The system of claim 5, wherein the supplemental liquid cooling loop comprises a supplemental pump and a supplemental coolant reservoir.

7. The system of claim 1, wherein failure of the primary cooling loop is identified by either a predetermined drop of total pressure in the primary cooling loop or by an unacceptable thermal rise in the plurality of electronic components.

8. The system of claim 7, wherein total pressure is a combination of dynamic and static pressure in the primary cooling loop.

9. The system of claim 1, wherein the primary liquid cooling loop is a data center liquid cooling loop.

10. The system of claim 1, wherein the primary liquid cooling loop is capable of maintaining thermally operable conditions for the plurality of electronic components.

11. A method for supplemental cooling of a plurality of electronic components, the method comprising:
    monitoring coolant flow and coolant temperature of a primary liquid cooling loop, wherein the primary liquid cooling loop is in thermal contact with the plurality of electronic components;
    determining whether the primary liquid cooling loop is failing to maintain the plurality of electronic components thermally operable; and
    responsive to failure of the primary liquid cooling loop to maintain the plurality of electronic components thermally operable, initiating a supplemental liquid cooling loop mitigating thermal rise in the plurality of electronic components.

12. The method of claim 11, wherein the supplemental liquid cooling loop is in thermal contact with the plurality of electronic components.

13. The method of claim 11, wherein the supplemental liquid cooling loop enables the plurality of electronic components to complete an organized shutdown prior to the plurality of electronic components being damaged from thermal rise.

14. The method of claim 11, wherein the supplemental liquid cooling loop enables the plurality of electronic components to save data prior to any data loss due to thermal rise.

15. The method of claim 11, further comprising, isolating the supplemental liquid cooling loop from the primary liquid cooling loop.

16. The method of claim 15, wherein the supplemental liquid cooling loop is independent of the primary liquid cooling loop, the supplemental liquid cooling loop comprising an air-cooled heat exchanger, a pump and a coolant reservoir.

17. The method of claim 11, wherein the primary liquid cooling loop is a data center liquid cooling loop.

18. The method of claim 11, wherein failure of the primary liquid cooling loop is indicated by a predetermined drop in coolant flow and/or a predetermined rise in coolant temperature.

19. A system for preventing overheating of a plurality of electronic components in the event of failure of a data center liquid cooling loop; the system comprising:
    a secondary liquid cooling loop in thermal contact with the plurality of electronic components, wherein the secondary liquid cooling loop enables the plurality of electronic components to complete an organized shutdown prior to the plurality of electronic components being damaged from thermal rise;
    a data center liquid coolant monitor, capable of monitoring coolant flow and coolant temperature in the data center liquid cooling loop, wherein a predetermined drop in coolant flow and/or a predetermined rise in coolant temperature indicates data center liquid cooling loop failure; and a cut-off valve in communication with the data center liquid coolant monitor, the cut-off valve capable of isolating the secondary liquid cooling loop from the data center liquid cooling loop responsive to the data center liquid coolant monitor identifying a data center liquid cooling loop failure.

20. The system of claim 19, wherein the secondary liquid cooling loop operates independent of the data center liquid cooling loop and comprises an air-cooled heat exchanger, a pump and a coolant reservoir.

* * * * *